United States Patent [19]

Buck et al.

[11] Patent Number: 4,543,566

[45] Date of Patent: Sep. 24, 1985

[54] ELECTRONIC MONITORING SYSTEM WITH MALFUNCTION INDICATOR

[75] Inventors: Robert Buck, Am Kirchbühl 28, 7995 Neukirch; Gerd Marhofer, Beckmannsbusch 67, 43 Essen-Bredeney; Hans-Dieter Gesthuysen, Essen-Kettwig, all of Fed. Rep. of Germany

[73] Assignees: Robert Buck, Neukirch; Gerd Marhofer, Essen, both of Fed. Rep. of Germany

[21] Appl. No.: 415,442

[22] Filed: Sep. 7, 1982

[30] Foreign Application Priority Data

Sep. 22, 1981 [DE] Fed. Rep. of Germany ....... 3137706
Mar. 17, 1982 [DE] Fed. Rep. of Germany ....... 3209673

[51] Int. Cl.$^4$ ............................................. G08B 29/00
[52] U.S. Cl. ..................................... 340/512; 340/652; 340/659
[58] Field of Search ............... 340/659, 511, 512, 652; 324/236

[56] References Cited

U.S. PATENT DOCUMENTS 3,611,338 10/1971 Kramer ............................... 340/659
4,135,124 1/1979 Buck .................................. 328/5 X Primary Examiner—James L. Rowland
Assistant Examiner—Daniel Myer
Attorney, Agent, or Firm—Karl F. Ross; Herbert Dubno

[57] ABSTRACT

A contactless motion detector responsive to the approach of a ferromagnetic element, including an oscillator with a sensing coil, has an output lead connected to one input of a first Exclusive-OR gate having another input connected to a square-wave generator whose pulses appear in the output of that gate with or without phase inversion depending on the output voltage of the motion detector. These pulses are fed, via an amplifier, to one input of a second Exclusive-OR gate whose other input receives the output pulses of the square-wave generator directly but with a delay compensating a lag introduced by the first gate and the amplifier. In the absence of a malfunction, the inputs of the second gate are energized either cophasally or antiphasally to produce either a low or a high output voltage of substantially constant magnitude fed to a load; in the event of a malfunction interrupting the pulse transmission to either input of this second gate, its output becomes a pulsating voltage. Such malfunction can further be indicated by an integrator connected in parallel with the second gate to the amplifier output. A conductor connecting the output of the square-wave generator to the corresponding input of the first gate is preferably led inside a housing around the motion detector, in front of its sensing coil, in order to let a damaging physical force aimed at the detector disrupt that conductor for giving rise to a malfunction indication.

15 Claims, 3 Drawing Figures

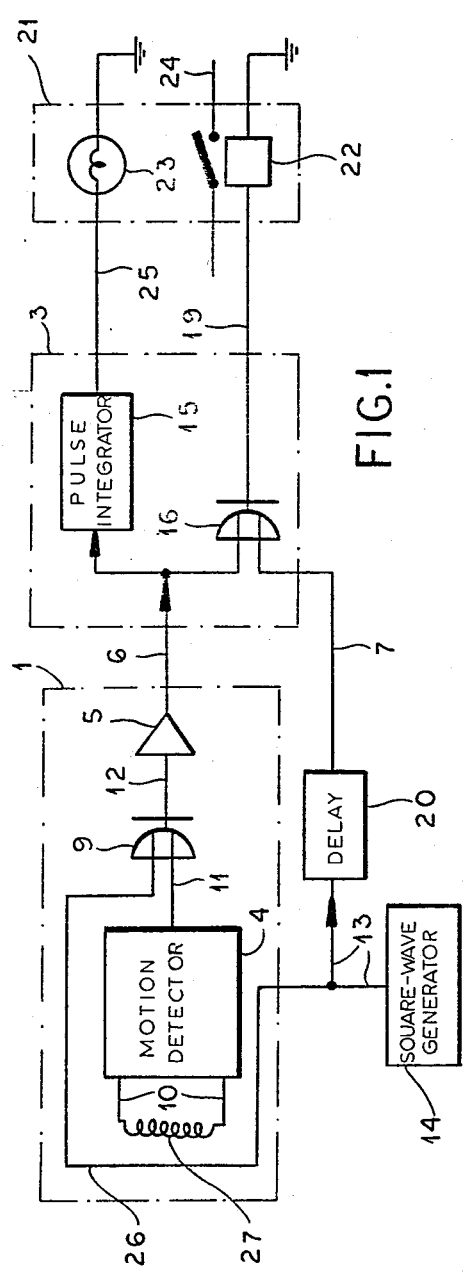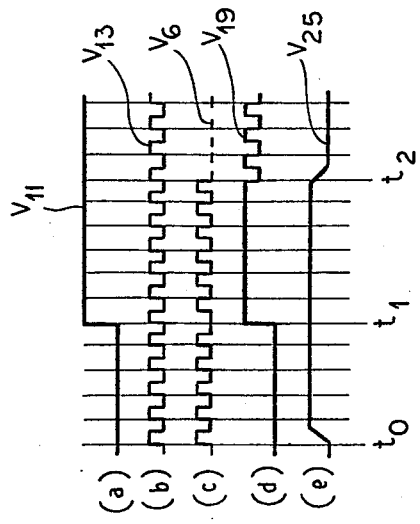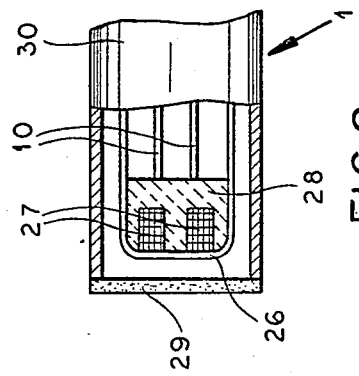
FIG.1
FIG.3
FIG.2

ELECTRONIC MONITORING SYSTEM WITH MALFUNCTION INDICATOR

FIELD OF THE INVENTION

Our present invention relates to an electronic monitoring system, of the type including a contactless motion detector or the like which is sensitive to an ambient condition for generating on an output lead a binary load-control signal assuming a predetermined value in response to a significant change in that condition, and more particularly to a malfunction indicator associated with such a system.

BACKGROUND OF THE INVENTION

Monitoring systems of this type have been described, for example, in U.S. Pat. No. 4,193,023 issued in the names of two of us, Robert Buck and Gerd Marhofer, and in various earlier patents cited therein. A system of this nature usually includes an electronic switch, such as a thyristor, which is triggered to energize a load for signaling the occurrence of the event to be monitored. The trigger signal may be derived from the output of an oscillator whose amplitude changes, e.g. in response to the approach of a ferromagnetic element, as a result of such occurrence.

U.S. Pat. No. 4,135,124 in the name of Robert Buck, discloses the use of an Exclusive-OR gate as a means for enabling the selective emission of a high or a low output signal upon an increase or a decrease of the oscillator voltage whereby an electronic switch such as a thyristor will fire when the element being monitored either approaches or departs from the vicinity of the motion detector; with its anode tied to a supply of raw-rectified alternating voltage, the thyristor is continuously retriggered in the presence of a high voltage at the output of the Ex-OR gate so as to draw an increased load current. The Ex-OR gate, therefore, acts as a selective inverter for the control signal emitted by the motion detector.

Since the load current in such a system is either "on" or "off", depending on the conductive or nonconductive state of the electronic switch, a malfunction resulting in a prolonged absence of such load current may go undiscovered by being wrongly interpreted as either the occurrence or the nonoccurrence of the event to be detected. It is therefore desirable to provide means in a system of this nature for indicating the existence of a malfunction to an operator. For this purpose it has already been proposed to provide the system with two outputs carrying antivalent signals so that either one or the other output will conduct in any event. Under some circumstances, however, a malfunction could disable the detector while still keeping one of these outputs energized.

OBJECT OF THE INVENTION

The object of our present invention, therefore, is to provide improved malfunction-indicating means in a monitoring system of this character which practically excludes the possibility that a failure of the detector or a breakdown in its output circuit be overlooked.

SUMMARY OF THE INVENTION

We realize this object, in accordance with our present invention, by providing a source of a train of recurrent pulses along with modulating means connected to that source and to an output lead of the associated detector for shifting the phase of these pulses whenever the binary load-control signal present on that lead assumes a certain value, the modulating means being connected to supervisory means for emitting an alarm indication in response to a malfunction-induced interruption of the pulse train emitted by the source.

Since the pulse train—whether phase-shifted or not—will always reach the supervisory means during normal operation, its absence will be a sure sign that a malfunction has occurred. The supervisory means may include for this purpose a pulse integrator generating a finite test signal during normal operation.

While the pulse train could be phase-modulated in various ways to indicate the occurrence or nonoccurrence of the condition monitored, e.g. the approach or departure of a ferromagnetic element in a machine tool or the like, we prefer to design the modulating means as an anticoincidence gate of the Exclusive-OR type which, in acting as a selective inverter as known per se from the aforementioned U.S. Pat. No. 4,135,124, transmits the incoming pulses with or without phase inversion. When the pulse source is a square-wave generator with a duty ratio of substantially 50%, the magnitude of the test signal emitted by the aforementioned pulse integrator will remain virtually unchanged in the event of a phase reversal.

Pursuant to a more particular feature of our invention, the pulse train issuing from the anticoincidence gate is fed—preferably after an amplification—to a comparator in the form of a second Exclusive-OR gate forming part of the supervisory means. Another input of this second Ex-OR gate receives a reference wave from the pulse generator so that the two pulse trains appearing at that gate are either in phase or in phase opposition, depending on the output signal of the detector. The output voltage of the second Ex-OR gate will be very low (theoretically zero) in the case of cophasal pulses but will be relatively high in the presence of antiphasal pulses; this voltage, therefore, can serve as a useful d-c signal turning a load on and off. If, however, a malfunction interrupts the pulse train coming from the first Ex-OR gate, this output voltage will be intermittent and therefore of reduced but non-zero average amplitude; the simultaneous disappearance of the test signal will further indicate the off-normal condition.

In copending application Ser. No. 202,234 filed 30 Oct. 1980 by two of us, namely Robert Buck and Gerd Marhofer, there has been disclosed a motion detector including an oscillator with a sensing coil forming part of a modular unit enclosed in a housing. Inasmuch as such a unit is often located in an exposed position, it may be potentially subjected to damaging physical forces which could impair its operation without necessarily producing a direct indication of malfunction. We therefore propose, pursuant to another more specific feature of our invention, to connect the pulse source to the modulating means by a conductor disposed close to that unit preferably inside its housing, so that this lead will sustain a malfunction-indicating disruption upon the occurrence of such damaging forces.

BRIEF DESCRIPTION OF THE DRAWING

The above and other features of our invention will now be described in detail with reference to the accompanying drawing in which:

FIG. 1 is a block diagram showing a monitoring system equipped with a malfunction indicator according to our invention;

FIG. 2 is a fragmentary view, partly in section, of a modular unit included in the system of FIG. 1; and FIG. 3 is a set of graphs relating to the operation of the system.

SPECIFIC DESCRIPTION

In FIG. 1 we have shown a modular unit 1 including an oscillator with wires 10 connecting a sensing coil 27 in its tank circuit. An external square-wave generator 14 has an output lead 13 with a branch 26 which passes within modular unit 1, in a manner more fully described hereinafter with reference to FIG. 2, between one input of an Ex-OR gate 9 whose other input is connected to an output lead 11 of motion detector 4. The output 12 of gate 9 is connected to a lead 6 by way of an amplifier 5 which could be a transistor but may also comprise a thyristor-type electronic switch energized with a pulsating voltage, as described above, provided that the frequency of these pulsations is much higher than that of the square wave emitted by generator 14. Depending on the magnitude of the binary signal appearing on output lead 11, the square wave on lead 6 will be either in phase or in phase opposition with the reference wave on the output lead 13 of generator 14.

Lead 6 extends to a supervisory circuit 3 including a pulse integrator 15 in parallel with one input of a second Ex-OR gate 16, acting as a comparator, whose other input is connected to lead 13 via a delay line 20 serving to compensate a lag introduced by gate 9 and amplifier 5 in the signal path from lead 13 to lead 6. With pulses on leads 6 and 7 either cophasal or antiphasal, as explained above, an output lead 19 of gate 16 will carry a useful d-c signal of relatively low or relatively high magnitude fed to a load 22 in a utilization stage 21, this load being here shown as a relay controlling an output circuit 24. Stage 21 further includes an indicator lamp 23 connected to an output lead 25 of pulse integrator 15 so as to be lit as long as the square wave arriving on lead 6 is uninterrupted.

As shown in FIG. 2, modular unit 1 comprises a metallic (usually grounded) cylindrical housing 30 in which the coil 27 is embedded in a ferrite pot 6 at a front end of that housing closed by a covering 29, e.g. of carbonaceous material as described in the aforementioned copending application Ser. No. 202,234. The conductor 26 extending from the output lead 13 of square-wave generator 14 (FIG. 1) lies for the most part within housing 30 where it encircles the sensitive components of motion detector 4, including the oscillator connected by wires 10 to coil 27. Conductor 26 is seen to pass in front of that coil in order to be ruptured by any destructive force which may strike that coil through front covering 29, e.g. in the event of an accidental collision with a moving element. Gate 9 and amplifier 5 of FIG. 1 may also be contained within housing 30.

Graph (a) of FIG. 3 shows the output signal $V_{11}$ of motion detector 4 appearing on lead 11; this signal is assumed to have initially a logical value of "0" at an instant $t_0$ and to change at an instant $t_1$ into a logical "1". Graph (b) shows the square wave $V_{13}$ emitted on lead 13 by generator 14, this square wave appearing on lead 6 as a voltage $V_6$ illustrated in graph (c) which is in phase with square wave $V_{13}$ up to instant $t_1$ and is subsequently in phase opposition therewith. The output signal $V_{19}$ of gate 16, present on lead 19, is shown in graph (d) and rises from a logical "0" at instant $t_1$ to a logical "1". In graph (e) there is represented the output voltage $V_{25}$ of integrator 15 which goes high shortly after commencement of operations at instant $t_0$ and stays at that level beyond the switchover occurring at instant $t_1$. The delays caused by line 20 and components 5, 9 have been disregarded.

Let us assume that a breakdown cutting off the pulses on lead 6 occurs at an instant $t_2$. Thus, voltage $V_6$ goes to zero at this point while the pulses on leads 13 and 7 are passed without phase change through Ex-OR gate 16 as indicated at $V_{19}$ in graph (d). Voltage $V_{25}$ on lead 25 promptly disappears to extinguish the signal lamp 23, thereby indicating to the operator that a malfunction has occurred.

If generator 14 is disabled for any reason, an alarm will again be given by extinction of lamp 23 even as voltage $V_{19}$ goes to zero.

If desired, signal lamp 23 could be replaced or supplemented by a switch deactivating an apparatus served by the monitoring system of FIG. 1, e.g. a machine tool, in the event of a malfunction.

We claim:

1. In an electronic monitoring system including a detector sensitive to an ambient condition for generating on an output lead a binary load-control signal assuming a predetermined value in response to a significant change in said ambient condition;

the combination therewith of:
a source of a train of recurring pulses;
modulating means connected to said source and to said output lead for shifting the phase of said pulses upon said load-control signal assuming said predetermined value; and
supervisory means connected to said modulating means for emitting an alarm indication in response to a malfunction-induced interruption of said train of pulses, said modulating means comprising an anticoincidence gate of the Exclusive-OR type selectively inverting the phase of said train of pulses in response to said load-control signal, said supervisory means comprising a pulse integrator generating a finite test signal in the absence of a malfunction, said source comprising a square-wave generator, said supervisory means further including a comparator with inputs respectively connected to said modulating means and to said square-wave generator for producing a useful d-c signal of a magnitude depending upon the relative phasing of the pulses received by said comparator.

2. The combination defined in claim 1 wherein said square-wave generator has a duty ratio of substantially 50%.

3. The combination defined in claim 1 or 2 wherein said comparator comprises a second Exclusive-OR gate.

4. The combination defined in claim 3, further comprising delay means inserted between said square-wave generator and said second Exclusive-OR gate for compensating a lag introduced in said modulating means.

5. The combination defined in claim 1 or 2, further comprising an amplifier inserted between said anticoincidence gate and said supervisory means.

6. The combination defined in claim 1, or 2 wherein said detector comprises a modular unit potentially subjected to damaging physical forces, said source being connected to said modulating means by a conductor disposed close to said modular unit for sustaining a malfunction-indicating disruption upon the occurrence of such damaging forces.

7. The combination defined in claim 6 wherein said modular unit includes an oscillator with a sensing coil at a front end of a housing enclosing said modular unit, said conductor extending within said housing across said coil at said front end.

8. In an electronic monitoring system including a detector sensitive to an ambient condition for generating on an output lead a binary load-control signal assuming a predetermined value in response to a significant change in said ambient condition, the combination therewith of:

a source of a train of recurring pulses and including a pulse generator;

modulating means connected to said source and to said output lead for shifting the phase of said pulses upon said load-control signal assuming said predetermined value; and supervisory means connected to said modulating means for emitting an alarm indication in response to a malfunction-induced interruption of said train of pulses, said modulating means comprising an anticoincidence gate of the Exclusive-OR type selectively inverting the phase of said train of pulses in response to said load-control signal, said supervisory means including a comparator with inputs respectively connected to said modulating means and to said pulse generator for producing a useful d-c signal of a magnitude depending upon the relative phasing of the pulses received by said comparator.

9. The combination defined in claim 8 wherein said pulse generator has a duty ratio of substantially 50%.

10. The combination defined in claim 8 wherein said comparator comprises a second Exclusive-OR gate.

11. The combination defined in claim 10, further comprising delay means inserted between said pulse generator and said second Exclusive-OR gate for compensating a lag introduced in said modulating means.

12. The combination defined in claim 8, further comprising an amplifier inserted between said anticoincidence gate and said supervisory means.

13. The combination defined in claim 8 wherein said detector comprises a modular unit potentially subjected to damaging physical forces, said source being connected to said modulating means by a conductor disposed close to said modular unit for sustaining a malfunction-indicating disruption upon the occurrence of such damaging forces.

14. The combination defined in claim 13 wherein said modular unit includes an oscillator with a sensing coil at a front end of a housing enclosing said modular unit, said conductor extending within said housing across said coil at said front end.

15. In an electronic monitoring system including a detector sensitive to an ambient condition for generating on an output lead a binary load-control signal assuming a predetermined value in response to a significant change in said ambient condition, the combination therewith of:

a source of a train of recurring pulses;

modulating means connected to said source and to said output lead for shifting the phase of said pulses upon said load-control signal assuming said predetermined value; and supervisory means connected to said modulating means for emitting an alarm indication in response to a malfunction-induced interruption of said train of pulses, said detector comprising a modular unit potentially subjected to damaging physical forces, said source being connected to said modulating means by a conductor disposed close to said modular unit for sustaining a malfunction-indicating disruption upon the occurrence of such damaging forces, said modular unit including an oscillator with a sensing coil at a front end of a housing enclosing said modular unit, said conductor extending within said housing across said coil at said front end.

* * * * *